United States Patent
Suto

(10) Patent No.: US 8,772,944 B2
(45) Date of Patent: Jul. 8, 2014

(54) SEMICONDUCTOR DEVICE AND METHOD FOR MANUFACTURING SEMICONDUCTOR DEVICE

(75) Inventor: Tadanori Suto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 301 days.

(21) Appl. No.: 13/344,396

(22) Filed: Jan. 5, 2012

(65) Prior Publication Data

US 2012/0175781 A1 Jul. 12, 2012

(30) Foreign Application Priority Data

Jan. 12, 2011 (JP) .................................. 2011-003580

(51) Int. Cl.
 *H01L 23/52* (2006.01)

(52) U.S. Cl.
 USPC ............ 257/774; 257/E23.001; 257/E21.158; 438/640

(58) Field of Classification Search
 CPC ................. H01L 2924/1461; H01L 21/02063; H01L 21/486; H01L 21/76804
 USPC ............ 257/774, E23.001, E21.158; 438/640
 See application file for complete search history.

(56) References Cited

U.S. PATENT DOCUMENTS

| 7,442,642 B2 | 10/2008 | Dotta |
| 7,732,925 B2 | 6/2010 | Okayama |
| 2009/0084588 A1 | 4/2009 | Sekine |
| 2010/0171223 A1 | 7/2010 | Kuo |
| 2010/0327422 A1 | 12/2010 | Lee |

FOREIGN PATENT DOCUMENTS

| CN | 1779962 A | 5/2006 |
| CN | 101771020 A | 7/2010 |
| FR | 2901635 A1 | 11/2007 |
| JP | 2007-059796 A | 3/2007 |
| JP | 2008-294062 A | 12/2008 |
| KR | 10-2008-0019429 A | 3/2008 |
| KR | 10-2010-0081271 A | 7/2010 |

*Primary Examiner* — Elias M Ullah

(74) *Attorney, Agent, or Firm* — Canon U.S.A., Inc., IP Division

(57) ABSTRACT

A semiconductor substrate includes a via-hole that extends from a first surface to a second surface. An electrode pad layer that serves as the bottom of the via-hole is disposed on the second surface. An insulating layer is formed on the first surface of the semiconductor substrate and the sidewall of the via-hole. A metal layer is formed on the first surface of the semiconductor substrate and the sidewall of the via-hole with the insulating layer interposed therebetween and is directly formed on the bottom of the via-hole. An inclined surface is formed on the sidewall of the via-hole such that the bottom of the via-hole has a smaller opening size than the open end of the via-hole. The inclined surface has asperities.

4 Claims, 7 Drawing Sheets

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device having a metal layer on a via-hole formed in a semiconductor substrate, such as a microelectromechanical system (MEMS) substrate, and a method for manufacturing the semiconductor device.

2. Description of the Related Art

In recent years, semiconductor devices having an electroconductive layer on a via-hole formed in a semiconductor substrate, such as a microelectromechanical system (MEMS) substrate, have been used as semiconductor chips for semiconductor memories, image pickup elements, sensors, and light-emitting elements. The via-hole has an electrode pad layer on the bottom thereof. Such semiconductor devices are being applied and developed in various fields, such as the fields of semiconductor packages each including layers of semiconductor chips, the fields of integrated circuit boards for use in micromachines, and the fields of semiconductor modules to be connected to the main bodies of ink jet heads.

Such semiconductor devices include a via-hole, which has an electrode pad layer on the bottom thereof, in a semiconductor substrate. The via-hole has an insulating layer on its sidewall and a metal layer therein (see U.S. Pat. No. 7,442,642). This structure can minimize an electric leakage between the semiconductor substrate and the metal layer in electrically connecting an electrode on the front side to an electrode on the back side of the semiconductor substrate. An interlayer insulating layer is disposed between the semiconductor substrate and the electrode pad layer.

In general, the sidewall of a via-hole in a semiconductor substrate extending from the open end to the bottom thereof is perpendicular to the surfaces of the semiconductor substrate. Thus, there is a problem that the insulating layer or the metal layer tends to be detached from the via-hole in the semiconductor substrate.

In order to solve this problem, in one proposed structure, the opening size of a portion (enlarged portion) close to the bottom of the via-hole (the electrode pad layer) is larger than the opening size of a portion close to the open end of the via-hole (see U.S. Pat. No. 7,732,925). The formation of the insulating layer and the metal layer in the enlarged portion of the via-hole can decrease the likelihood that the insulating layer or the metal layer peels off from the semiconductor substrate because the insulating layer and the metal layer are caught on the enlarged portion. Thus, the insulating layer and the metal layer satisfactorily formed in the enlarged portion can decrease the likelihood that the insulating layer or the metal layer peels off from the semiconductor substrate.

In such a structure having an enlarged portion in a via-hole, however, particles to be deposited sometimes cannot reach the enlarged portion, resulting in a poor insulating layer or metal layer in the enlarged portion. This is particularly noticeable when the insulating layer or the metal layer is formed by physical vapor deposition (hereinafter referred to as PVD). More specifically, in PVD, particles to be deposited linearly enter the via-hole. Thus, the sidewall adjacent to the enlarged portion extending toward the open end blocks the particles from reaching the enlarged portion. This results in insufficient deposition. The insufficient deposition may cause the insulating layer or the metal layer to peel off. A discontinuous metal layer in the enlarged portion may cause disconnection.

SUMMARY OF THE INVENTION

Aspects of the present invention provide a semiconductor device in which an insulating layer and a metal layer in a via-hole are effectively prevented from peeling off and a method for manufacturing the semiconductor device.

Aspects of the present invention provide a semiconductor device that includes a semiconductor substrate having a via-hole that extends from a first surface to a second surface of the semiconductor substrate; an electrode pad layer disposed on the second surface of the semiconductor substrate, the electrode pad layer serving as the bottom of the via-hole; an insulating layer disposed on the first surface of the semiconductor substrate and on the sidewall of the via-hole; and a metal layer disposed on the insulating layer and on the bottom of the via-hole, wherein the sidewall of the via-hole has an inclined surface such that the bottom of the via-hole has a smaller opening size than the open end of the via-hole, and the inclined surface has asperities.

In accordance with aspects of the present invention, the asperities on the inclined surface of the sidewall of the via-hole can improve the adhesion of the insulating layer and the metal layer to the sidewall of the via-hole and thereby effectively decrease the likelihood that the insulating layer or the metal layer in the via-hole peels off from the semiconductor substrate.

Further features of the present invention will become apparent from the following description of exemplary embodiments with reference to the attached drawings.

DESCRIPTION OF THE EMBODIMENTS

Figure 1:
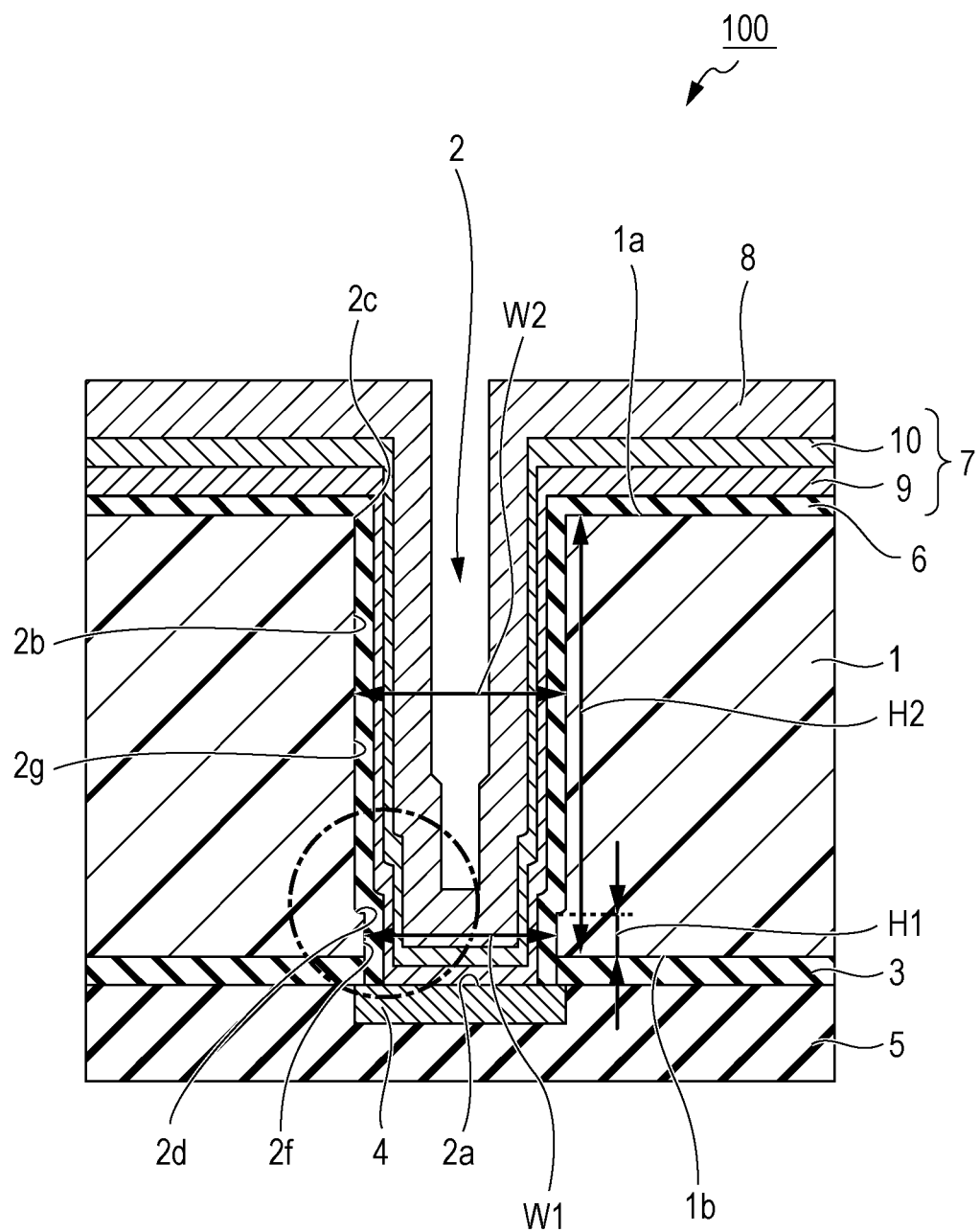
FIG. 1 is a schematic cross-sectional view of a semiconductor device according to an embodiment of the present invention.

The embodiments of the present invention will be described in detail below with reference to the accompanying drawings. FIG. 1 is a schematic cross-sectional view of a semiconductor device according to an embodiment of the present invention. A semiconductor device 100 illustrated in FIG. 1 includes a semiconductor substrate 1. The semiconductor substrate 1 includes a via-hole 2 that extends from a first surface 1a to a second surface 1b. The semiconductor substrate 1 may be made of a semiconductor material, such as silicon. An electrode pad layer 4 is formed on the second surface 1b of the semiconductor substrate 1 and serves as the bottom 2a of the via-hole 2. The electrode pad layer 4 may be made of a metal (electroconductive material), such as aluminum alone or an aluminum alloy with copper or silicon. Thus, the via-hole 2 is composed of the electrode pad layer 4 serving as the bottom 2a and a semiconductor sidewall 2b. The interlayer insulating layer 3 and the electrode pad layer 4 on the second surface 1b of the semiconductor substrate 1 are covered with a passivation layer 5, which is made of an insulating resin material.

The semiconductor device 100 includes an insulating layer 6 disposed on the first surface 1a of the semiconductor substrate 1 and the sidewall 2b of the via-hole 2, a metal layer 7 disposed on the insulating layer 6 and the bottom 2a of the via-hole 2, and an electroconductive layer 8 disposed on the metal layer 7. The metal layer 7 includes a barrier layer 9 and a seed layer 10.

The insulating layer 6 may be made of an inorganic or organic material. Examples of the inorganic material include, but are not limited to, silicon nitride and silicon oxide. Examples of the organic material include, but are not limited to, parylene, polyimide, and polyurea. The insulating layer 6 may also be made of any other material having excellent insulating properties. The barrier layer 9 may be made of titanium, tantalum, or tungsten, or an alloy or nitride thereof, or a material mainly composed of nickel, chromium, cobalt, or molybdenum. The barrier layer 9 may also be made of any other material provided that the material can minimize interdiffusion between the seed layer 10 and the electrode pad layer 4 and has sufficiently low electrical resistance. The seed layer 10 and the electroconductive layer 8 may be made of the same material, for example, but not limited to, copper, gold, silver, or nickel.

The metal layer 7 and the electroconductive layer 8 can electrically connect a functional component (such as a semiconductor element) (not shown) disposed on the first surface 1a of the semiconductor substrate 1 to another functional component (such as a semiconductor element) (not shown) disposed on the second surface 1b, through the via-hole 2. Thus, the metal layer 7 and the electroconductive layer 8 are formed on the first surface 1a of the semiconductor substrate 1 and the sidewall 2b of the via-hole 2 while the insulating layer 6 is interposed therebetween to electrically insulate the semiconductor substrate 1 from the metal layer 7 and the electroconductive layer 8.

The insulating layer 6 and the metal layer 7 (the barrier layer 9 and the seed layer 10) may be formed by chemical vapor deposition (hereinafter referred to as CVD) or physical vapor deposition (PVD). In the vapor deposition, attention should sometimes be given to the heat resistance of a functional component on the semiconductor substrate 1 or the material for the functional component. More specifically, the semiconductor substrate 1 is exposed to a higher temperature in CVD than in PVD. Thus, the metal layer 7 or the insulating layer 6 may not be formed by CVD. In such a case, the metal layer 7 or the insulating layer 6 may be formed by PVD at low temperature rather than CVD.

The electroconductive layer 8 can be formed by electroplating using the seed layer 10 as a cathode. Although the electroconductive layer 8 in the via-hole 2 has a substantially uniform thickness in FIG. 1, the via-hole 2 may be filled with the electroconductive layer 8.

Although the electroconductive layer 8 is disposed on the metal layer 7 composed of the barrier layer 9 and the seed layer 10 in the embodiment described above, an electroconductive ink mainly composed of a metal may also be used.

Figure 2A:
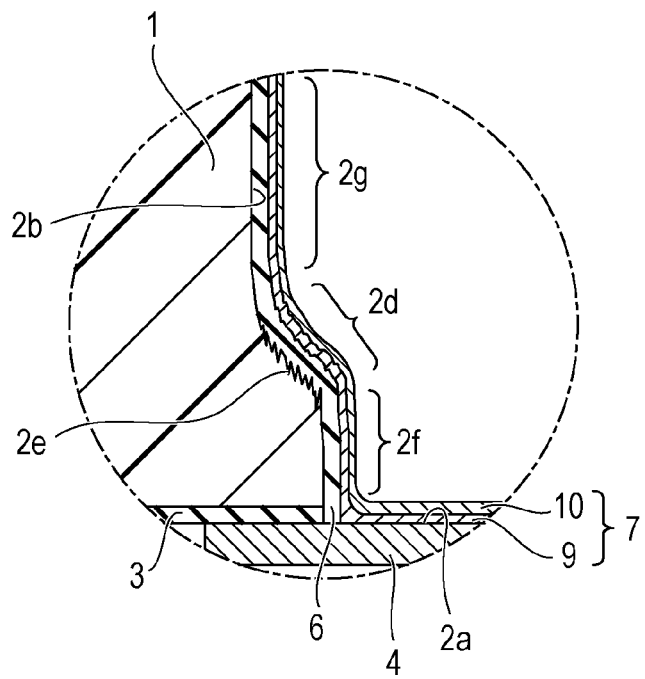
FIG. 2A is an enlarged schematic view of the portion indicated by the alternate long and short dashed line in FIG. 1, illustrating an inclined surface of a via-hole and its vicinity including a first vertical surface.
Figure 2B:
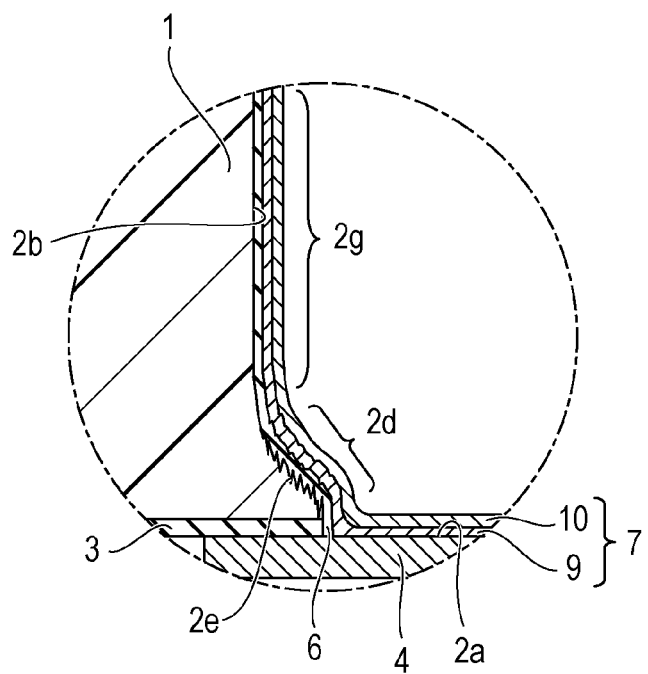
FIG. 2B is an enlarged schematic view of the portion indicated by the alternate long and short dashed line in FIG. 1, illustrating an inclined surface of a via-hole and its vicinity including no first vertical surface.

FIGS. 2A and 2B are enlarged schematic views of the portion indicated by the alternate long and short dashed line in FIG. 1, illustrating the inclined surface of the via-hole and the vicinity of the inclined surface. As illustrated in FIG. 2A, in accordance with the present embodiment, an inclined surface 2d is formed on the sidewall 2b of the via-hole 2 such that the bottom 2a of the via-hole 2 has a smaller opening size than the open end 2c of the via-hole 2. The inclined surface 2d has needle-like asperities 2e. The sidewall 2b of the via-hole 2 has a first vertical surface 2f and a second vertical surface 2g. The first vertical surface 2f is disposed close to the bottom of the via-hole 2 relative to the inclined surface 2d. The second vertical surface 2g is disposed close to the open end of the via-hole 2 relative to the inclined surface 2d.

The inclined surface 2d is inclined so as to be seen from the open end 2c of the via-hole 2 (so as to face the open end 2c of the via-hole 2). Thus, particles to be deposited by PVD can be satisfactorily deposited on the via-hole 2 without being affected by the shadowing effect. In other words, the formation of the insulating layer 6 and the metal layer 7 by PVD can avoid insufficient deposition on the via-hole 2. As a matter of course, the formation of the insulating layer 6 and the metal layer 7 by CVD can also avoid insufficient deposition on the via-hole 2. The insulating layer 6 and the metal layer 7 in the via-hole 2 are firmly adhered to the semiconductor substrate 1 by the action of the asperities 2e, thus decreasing the likelihood that the insulating layer 6 or the metal layer 7 peels off from the semiconductor substrate 1.

The inclined surface 2d may be disposed in the vicinity of the bottom 2a of the via-hole 2. As illustrated in FIG. 2B, the first vertical surface 2f may be very short or may not exist. Thus, the sidewall 2b of the via-hole 2 may be constituted of the inclined surface 2d and the second vertical surface 2g. Although there is only one inclined surface 2d in the present embodiment, a plurality of inclined surfaces in the depth direction of the via-hole 2 with a vertical surface interposed therebetween also have substantially the same effects.

The asperities 2e may have an average height Rc of 0.2 µm or more and 10 µm or less. The asperities having an average height Rc of less than 0.2 µm cannot improve the adhesion of the seed layer 10 by the anchoring effect. The asperities having an average height Rc of more than 10 µm cannot be covered with the insulating layer 6, the barrier layer 9, and the seed layer 10. The average height Rc of the asperities 2e can be measured by observing a polished cross-section of the inclined surface 2d having the asperities 2e in the via-hole 2 with a scanning electron microscope (SEM).

The length $H_1$ of the first vertical surface 2f may be at least 1/50 and 1/4 or less of the thickness $H_2$ of the semiconductor substrate 1. When the length $H_1$ of the first vertical surface 2f is less than 1/50 of the thickness $H_2$ of the semiconductor substrate 1, this tends to result in insufficient etching in the vicinity of the electrode pad layer 4. The length $H_1$ of the first vertical surface 2f is at least 1/50 of the thickness $H_2$ of the semiconductor substrate 1 because of ease with which the via-hole 2 can be formed. When the length $H_1$ of the first vertical surface 2f is more than 1/4 of the thickness $H_2$ of the semiconductor substrate 1, a portion of the insulating layer 6 or the metal layer 7 on the sidewall 2b in the vicinity of the electrode pad layer 4 tends to peel off from the semiconductor substrate 1. Thus, the length $H_1$ of the first vertical surface 2f may be 1/4 or less of the thickness $H_2$ of the semiconductor substrate 1.

The opening size $W_1$ of the via-hole 2 at the first vertical surface 2f may be at least one half and 9/10 or less of the opening size $W_2$ of the via-hole 2 at the second vertical surface 2g. When the opening size $W_1$ is 9/10 or more of but smaller than the opening size $W_2$, the inclined surface 2d is so small that it is difficult to improve the adhesion of the insulating layer 6 and the metal layer 7. The opening size $W_1$ may therefore be 9/10 or less of the opening size $W_2$. When the opening size $W_1$ is less than half of the opening size $W_2$, the opening size $W_1$ of the first vertical surface 2f in the vicinity of the electrode pad layer 4 is excessively small. This results in poor deposition in PVD, making it difficult to improve the adhesion of the insulating layer 6 or the metal layer 7. Thus, the opening size $W_1$ may be at least one half of the opening size $W_2$.

The first vertical surface 2f and the second vertical surface 2g are not necessarily perpendicular to the bottom 2a (the electrode pad layer 4) of the via-hole 2 and may form an angle of 83 degrees or more and 93 degrees or less with the bottom 2a (the electrode pad layer 4) of the via-hole 2. The inclined surface 2d may form an angle of zero degrees or more and less than 83 degrees with the bottom 2a (the electrode pad layer 4) of the via-hole 2. When the first and second vertical surfaces 2f and 2g form an angle of less than 83 degrees with the bottom 2a, with an increase in the thickness of the semiconductor substrate 1 or with an increase in the aspect ratio (length/width ratio) of the via-hole 2, the distance between the via-holes 2 increases. This limits the degree of freedom of design. When the first and second vertical surfaces 2f and 2g form an angle of more than 93 degrees with the bottom 2a, this results in poor deposition in PVD, making it difficult to improve the adhesion of the insulating layer 6 or the metal layer 7.

Figure 3A:
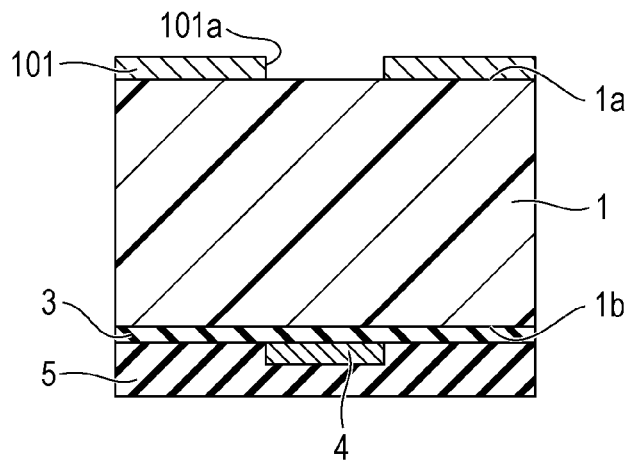
FIG. 3A is a schematic view of a process of forming a mask layer in the manufacture of a semiconductor device.
Figure 3B:
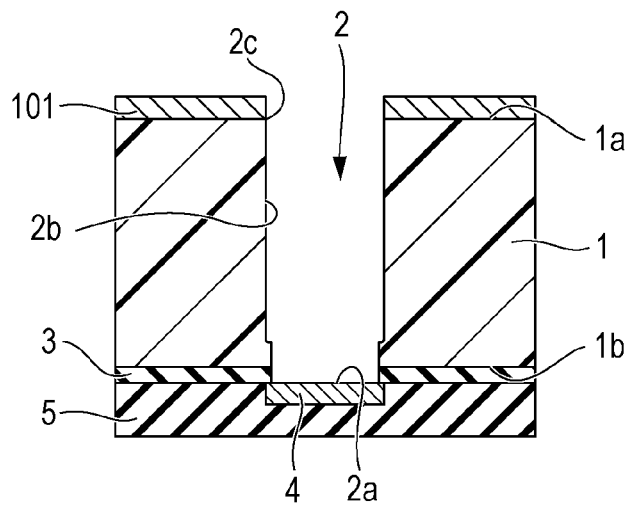
FIG. 3B is a schematic view of a process of forming a via-hole in the manufacture of the semiconductor device.
Figure 3C:
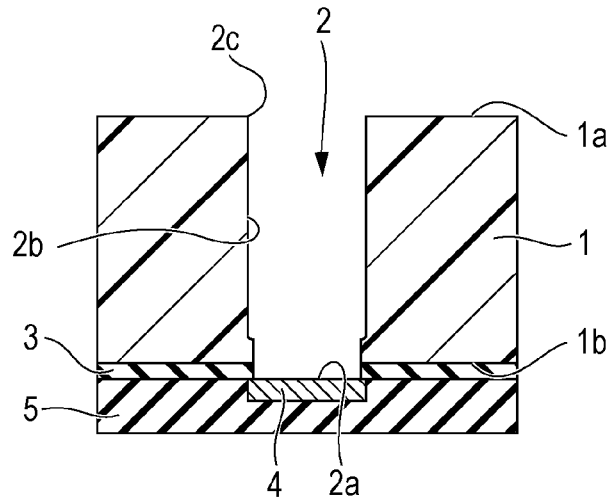
FIG. 3C is a schematic view of a process of removing the mask layer in the manufacture of the semiconductor device.
Figure 4A:
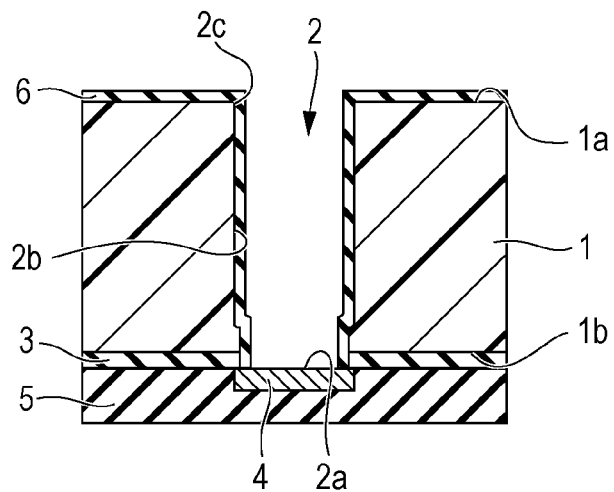
FIG. 4A is a schematic view of a process of forming an insulating layer in the manufacture of the semiconductor device.
Figure 4B:
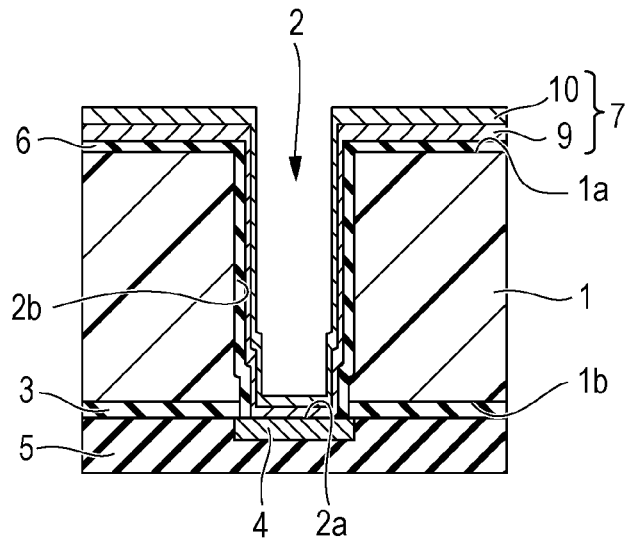
FIG. 4B is a schematic view of a process of forming a metal layer in the manufacture of the semiconductor device.
Figure 4C:
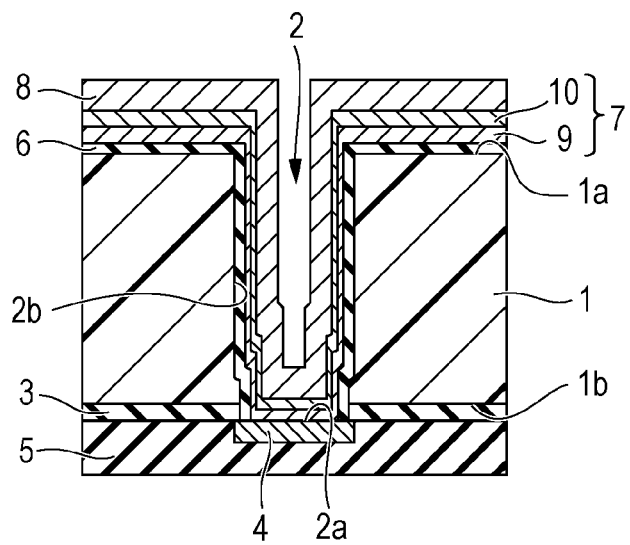
FIG. 4C is a schematic view of a process of forming an electroconductive layer in the manufacture of the semiconductor device.

A method for manufacturing a semiconductor device 100 will be described below. FIGS. 3A to 3C and FIGS. 4A to 4C are schematic views of the processes of manufacturing the semiconductor device 100. FIG. 3A illustrates a process of forming a mask layer. FIG. 3B illustrates a process of forming a via-hole. FIG. 3C illustrates a process of removing the mask layer. FIG. 4A illustrates a process of forming an insulating layer. FIG. 4B illustrates a process of forming a metal layer. FIG. 4C illustrates a process of forming an electroconductive layer.

As illustrated in FIG. 3A, a mask layer 101 is formed on the first surface 1a of the semiconductor substrate 1 (the process of forming a mask layer). The mask layer 101 has an opening 101a facing the electrode pad layer 4 disposed on the second surface 1b of the semiconductor substrate 1.

As illustrated in FIG. 3B, the via-hole 2 that extends from the opening 101a of the mask layer 101 formed by the process of forming a mask layer to the electrode pad layer 4 is formed in the semiconductor substrate 1 by a BOSCH method (the process of forming a via-hole). The BOSCH method involves alternate etching and deposition. As illustrated in FIG. 3C, the mask layer 101 is removed, for example, by using an etching gas (the process of removing a mask layer).

As illustrated in FIG. 4A, an insulating layer 6 is formed on the first surface 1a of the semiconductor substrate 1 and the sidewall 2b of the via-hole 2 formed by the process of forming a via-hole (the process of forming an insulating layer). In the present embodiment, the insulating layer 6 is formed by CVD. As long as the semiconductor substrate 1 can be maintained at a temperature lower than the maximum allowable temperature of a functional component, the insulating layer 6 can be formed by CVD. Otherwise, the insulating layer 6 may be formed by PVD.

As illustrated in FIG. 4B, the metal layer 7 composed of the barrier layer 9 and the seed layer 10 is formed on the first surface 1a of the semiconductor substrate 1 and the inside of the via-hole 2 by PVD (the process of forming a metal layer). More specifically, in the process of forming a metal layer, the metal layer 7 is formed on the first surface 1a of the semiconductor substrate 1 and the sidewall 2b of the via-hole 2 with the insulating layer 6 interposed therebetween and is directly formed on the bottom 2a (the electrode pad layer 4) of the via-hole 2. In the formation of the metal layer 7, the formation of the barrier layer 9 by PVD is followed by the formation of the seed layer 10 by PVD. The reason for the formation of the metal layer 7 by PVD is that the formation of the metal layer 7 by CVD may result in the temperature of the semiconductor substrate 1 higher than the maximum allowable temperature of the functional component. As illustrated in FIG. 4C, the electroconductive layer 8 is formed on the metal layer 7 (the process of forming an electroconductive layer). In the process of forming an electroconductive layer, the electroconductive layer 8 is formed by electroplating.

In the process of forming a via-hole according to the present embodiment, the inclined surface 2d is formed on the sidewall 2b of the via-hole 2, and the asperities 2e are formed on the inclined surface 2d. The inclined surface 2d and the asperities 2e are formed by a BOSCH method, which involves alternately supplying an etching gas and a gas for protecting a sidewall to alternately perform etching and deposition for protecting the sidewall 2b.

More specifically, the etching gas is sulfur hexafluoride, and the sidewall protecting gas is $C_4F_8$. The etching is performed under two conditions. A first condition involves low-power etching with a pulsed bias for the application time of approximately 20% to 50% per unit time. The phrase "the application time of 20% to 50%", as used herein, refers to 20% to 50% of a unit time, for example, between 1 and 12 seconds. A second condition involves etching with a high-power bias for the application time of approximately 1% to 10% per unit time. In the process of forming a via-hole, as etching proceeds in the depth direction of the via-hole 2, the etch rate is gradually decreased from the first condition to the second condition such that the bottom 2a of the via-hole 2 has a smaller opening size than the open end 2c of the via-hole 2. This results in the formation of the inclined surface 2d on the sidewall of the via-hole 2.

Figure 5A:
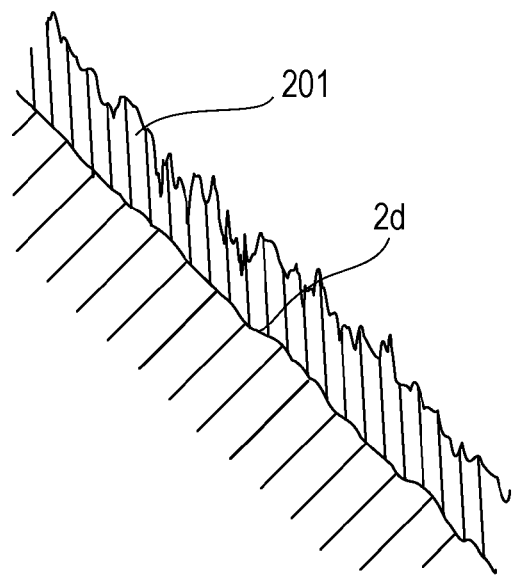
FIG. 5A is an explanatory view of the deposition of asperities on an inclined surface by a BOSCH method in a process of forming a via-hole.

After the formation of the inclined surface 2d, a portion corresponding to the first vertical surface 2f is formed by alternately performing etching and deposition. The deposition forms a protective film 201 on the inclined surface 2d, as illustrated in FIG. 5A. The protective film 201 may have an uneven thickness.

Figure 5B:
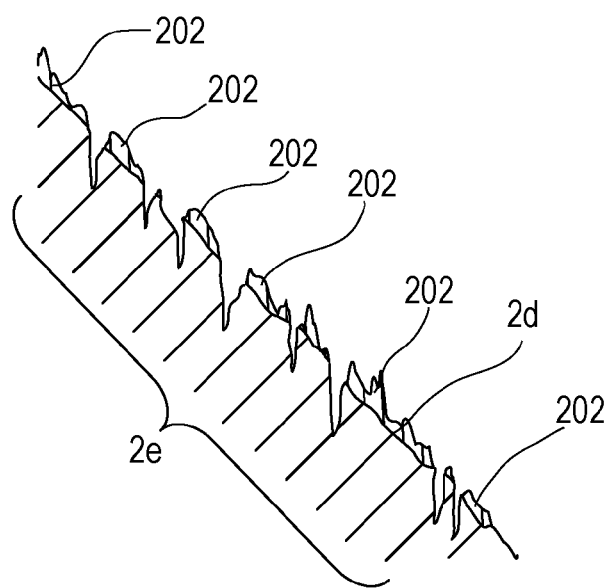
FIG. 5B is an explanatory view of the etching of the asperities on the inclined surface by the BOSCH method in the process of forming a via-hole.

As illustrated in FIG. 5B, the protective film 201 is then etched. The residue 202 of the protective film 201 formed by deposition remains on the inclined surface 2d. Further etching forms the asperities 2e on the inclined surface 2d while the residue 202 serves as a mask.

The asperities 2e formed on the inclined surface 2d of the sidewall 2b of the via-hole 2 can improve the adhesion of the insulating layer 6 and the metal layer 7 to the sidewall 2b of the via-hole 2 and effectively decrease the likelihood that the insulating layer 6 or the metal layer 7 in the via-hole 2 peels off from the semiconductor substrate 1. This can improve the reliability of the semiconductor device.

Figure 6A:
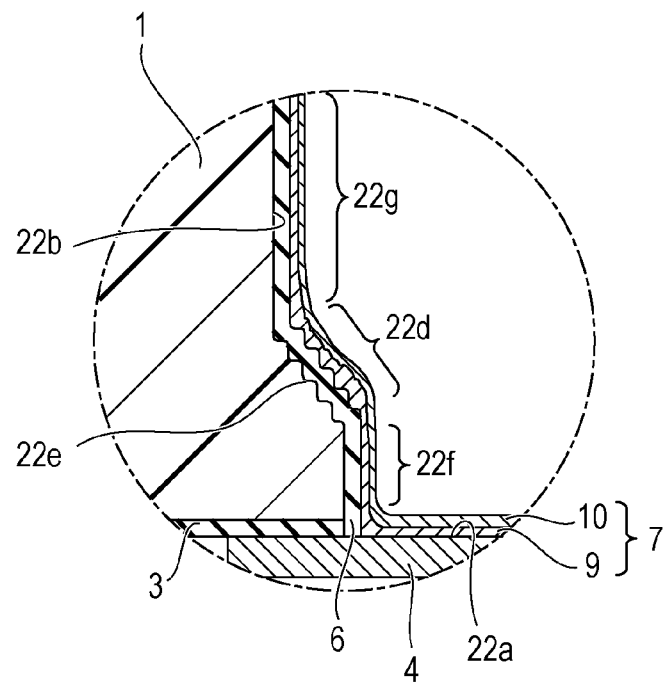
FIG. 6A is an enlarged schematic view of an inclined surface having steps and the vicinity of the inclined surface in a via-hole.

The formation of the needle-like asperities 2e on the inclined surface 2d has been described. In accordance with another embodiment, as illustrated in FIG. 6A, steps 22e may be formed on an inclined surface 22d. A first vertical surface 22f may be disposed close to the bottom of the via-hole 22 relative to the inclined surface 22d. A second vertical surface 22g may be disposed close to the open end of the via-hole 22 relative to the inclined surface 22d.

In this embodiment, the process of forming a mask layer, the process of removing the mask layer, the process of forming an insulating layer, the process of forming a metal layer, and the process of forming an electroconductive layer are as described above, but the process of forming a via-hole is different. More specifically, the etching gas is sulfur hexafluoride, and the sidewall protecting gas is $C_4F_8$. The etching is performed under two conditions. A first condition involves low-power etching with a pulsed bias for the application time of approximately 20% to 50% per unit time. A second condition involves etching with a high-power bias for the application time of approximately 1% to 10% per unit time. As etching proceeds in the depth direction of the via-hole 22, the etch rate is decreased stepwise from the first condition to the second condition such that the bottom 22a of the via-hole 22 has a smaller opening size than the open end of the via-hole 22. The phrase "decreased stepwise", as used herein, means that the etch rate is decreased by changing the power, for example, from 50 to 170 W in increments of 5 W for 5 seconds each. Thus, the inclined surface 22d having the asperities 22e is formed on the sidewall 22b of the via-hole 22.

The asperities 22e formed on the inclined surface 22d of the sidewall 22b of the via-hole 22 can improve the adhesion of the insulating layer 6 and the metal layer 7 to the sidewall 22b of the via-hole 22 and effectively decrease the likelihood that the insulating layer 6 or the metal layer 7 in the via-hole 22 peels off from the semiconductor substrate 1. This can improve the reliability of the semiconductor device.

Figure 6B:
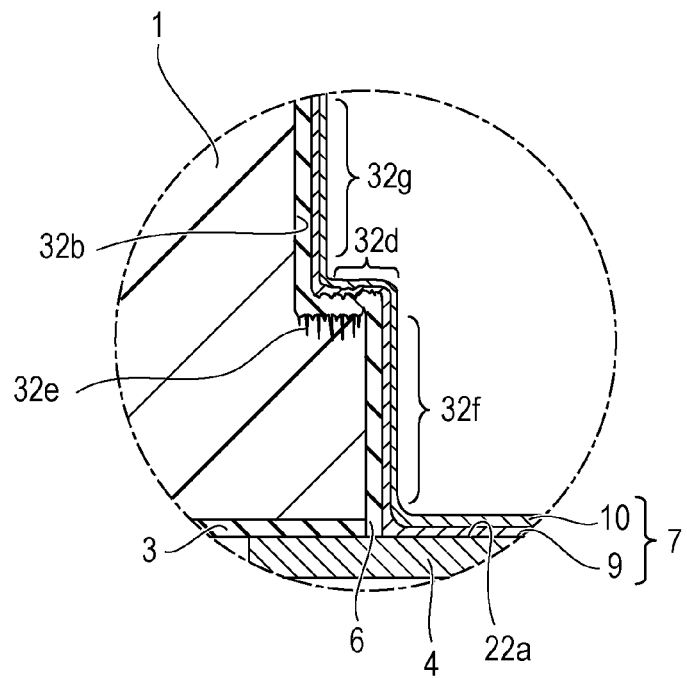
FIG. 6B is an enlarged schematic view of an inclined surface having ridges and grooves and the vicinity of the inclined surface in a via-hole.

In accordance with still another embodiment, as illustrated in FIG. 6B, ridges and grooves 32e may be formed on an inclined surface 32d. A first vertical surface 32f may be disposed close to the bottom of the via-hole 32 relative to the inclined surface 32d. A second vertical surface 32g may be disposed close to the open end of the via-hole 32 relative to the inclined surface 32d.

Figure 7A:
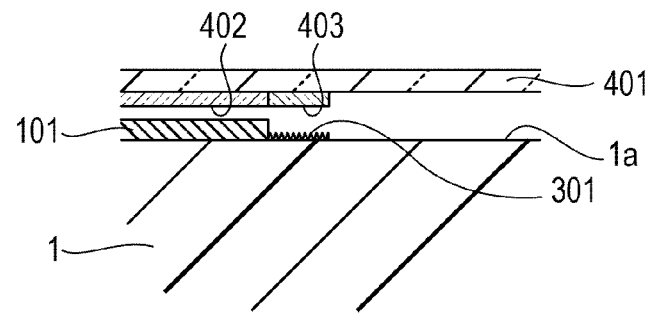
FIG. 7A is an explanatory view of the process of forming an inclined surface and asperities illustrated in FIG. 6B, illustrating the formation of a gray-tone mask on the bottom of a closed-end hole.

In this embodiment, the process of forming a mask layer, the process of removing the mask layer, the process of forming an insulating layer, the process of forming a metal layer, and the process of forming an electroconductive layer are as described above, but the process of forming a via-hole is different. The process of forming a via-hole will be more specifically described with reference to FIGS. 7A to 7C. As illustrated in FIG. 7A, a gray-tone mask 301 is formed on the first surface 1a of the semiconductor substrate 1. The gray-tone mask 301 has an opening smaller than the opening of the mask layer 101. More specifically, an exposure is performed while a light-shielding film (for example, Cr) 402 and a slit-like mask pattern 403 disposed on a glass plate 401 is placed opposite the mask layer 101 disposed on the first surface 1a of the semiconductor substrate 1. For example, a mask pattern having slits at intervals of 1.2 µm or less is irradiated with 365-nm ultraviolet light. This converts a portion facing the slit-like mask pattern 403 into the gray-tone mask 301, which is made of the material of the mask layer 101. The gray-tone mask 301 may have a smaller thickness than the mask layer 101 so as to be removed by etching by the BOSCH method during the formation of the via-hole 32. Etching to form the via-hole 32 gradually decreases the thickness of the mask layer 101. The mask layer 101 has such a thickness that the mask layer 101 remains on the first surface 1a of the semiconductor substrate 1 even when the via-hole 32 is formed by the process of forming a via-hole.

Figure 7B:
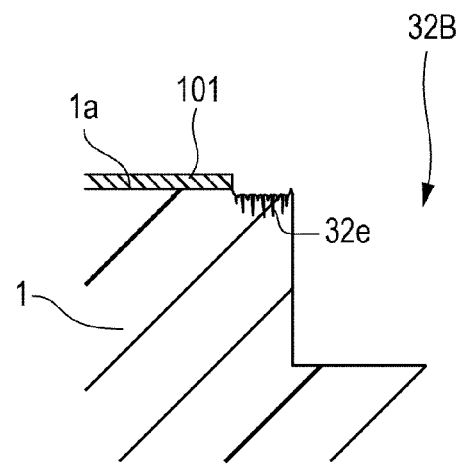
FIG. 7B is an explanatory view of FIG. 6B, illustrating the etching of a semiconductor substrate after the formation of the gray-tone mask.
Figure 7C:
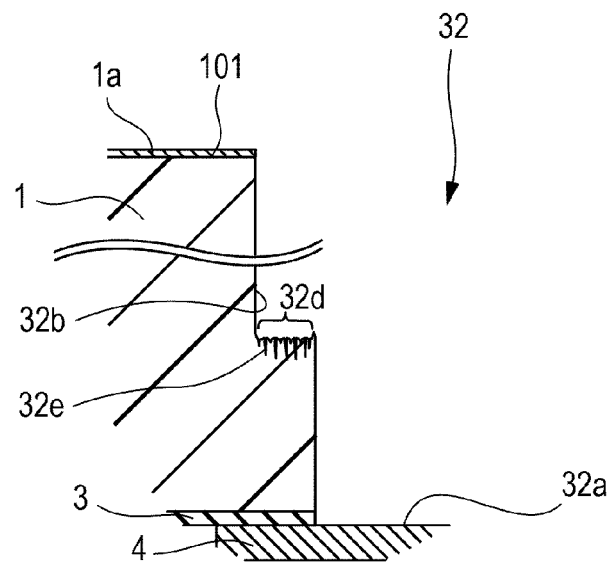
FIG. 7C is an explanatory view of FIG. 6B, illustrating the completion of the via-hole.

As illustrated in FIG. 7B, etching and deposition are alternately performed by the BOSCH method to form a closed-end hole 32B corresponding to the opening of the gray-tone mask 301. At the same time, asperities 32e are formed on the first surface 1a of the semiconductor substrate 1 corresponding to the gray-tone mask 301. The gray-tone mask 301 is gradually and completely removed by etching. As illustrated in FIG. 7C, etching and deposition are alternately performed by the BOSCH method to form the via-hole 32 having the electrode pad layer 4 as the bottom 32a. The portion of the semiconductor substrate 1 from which the gray-tone mask 301 has been completely removed is etched at the same etch rate as the bottom 32a of the closed-end hole 32B. Thus, the level of the asperities relative to the bottom 32a of the closed-end hole 32B is substantially maintained at the length of the first vertical surface 2f of the via-hole 32, though over-etching to improve the process stability may slightly (approximately 1 to 2 µm) lower the level.

Thus, the inclined surface 32d is formed on a portion of the sidewall 32b of the via-hole 32 corresponding to the gray-tone mask 301. The asperities 32e are formed on the inclined surface 32d through the gray-tone mask 301 by etching.

Thus, the asperities 32e formed on the inclined surface 32d of the sidewall 32b of the via-hole 32 can improve the adhesion of the insulating layer 6 and the metal layer 7 to the sidewall 32b of the via-hole 32 and effectively decrease the likelihood that the insulating layer 6 or the metal layer 7 in the via-hole 32 peels off from the semiconductor substrate 1. This can improve the reliability of the semiconductor device.

EXAMPLES

Example 1

A silicon substrate having a thickness of 200 µm was used as a semiconductor substrate. The silicon substrate included an interlayer insulating layer made of silicon dioxide. A semiconductor element and an electrode pad layer made of an aluminum-copper alloy were formed on the interlayer insulating layer. The semiconductor element was electrically connected to the electrode pad layer. A passivation layer was formed on the interlayer insulating layer and the electrode pad layer. The passivation layer included a silicon oxide layer and a silicon nitride layer. A resist mask layer was formed on the substrate opposite the semiconductor element by patterning a resist by photolithography. The resist mask layer had a circular opening having a diameter of 50 µm.

The silicon substrate was etched by a BOSCH process. The etching condition included a high-frequency power of 1800 W, a sulfur hexafluoride gas flow rate of 150 sccm, and a $C_4F_8$ gas flow rate of 70 sccm. The bias condition was continuously changed from the condition involving a pulsed bias at a power of 30 W for an application time of 40% to the condition involving a power of 250 W for an application time of 3%. This process formed a via-hole having a first vertical surface, an inclined surface, and a second vertical surface on its sidewall. The width of the via-hole was 50 μm at the second vertical surface and 42 μm at the first vertical surface. The second vertical surface had a length of 170 μm. The first vertical surface had a length of 15 μm. The inclined surface had asperities having an average height (Rc) of 0.9 μm. The inclined surface had needle-like asperities, as illustrated in FIG. 2A.

An insulating layer made of silicon oxide was then formed on the substrate opposite the semiconductor element and the sidewall of the via-hole by cathode plasma CVD. The insulating layer on the electrode pad layer was removed as follows: first, a mask layer made of a dry film resist was formed on the substrate opposite the semiconductor element. The mask layer had a circular opening having a diameter of 40 μm, which was concentric with the via-hole. The insulating layer on the electrode pad layer was etched by reactive ion etching (hereinafter referred to as RIE) using a carbon tetrafluoride gas through the mask layer made of the dry film resist.

A titanium barrier layer and a gold seed layer were formed by sputtering, which was a type of PVD. A gold electroconductive layer was formed by electroplating on the semiconductor substrate opposite the semiconductor element. The gold electroconductive layer had a substantially uniform thickness of 5 μm on average. The resulting semiconductor device had high reliability and improved adhesion of the insulating layer and the metal layer.

Example 2

As in Example 1, a silicon substrate that included a semiconductor element and had a thickness of 200 μm was used. A resist mask layer was formed on the substrate opposite the semiconductor element by patterning a resist. The resist mask layer had a circular opening having a diameter of 60 μm.

The silicon substrate was etched by the BOSCH process under the condition described in Example 1. The bias condition was changed stepwise from the condition involving a pulsed bias at a power of 30 W for an application time of 40% to the condition involving a power of 250 W for an application time of 3%. This process formed a via-hole having a first vertical surface, an inclined surface, and a second vertical surface on its sidewall. The width of the via-hole was 60 μm at the second vertical surface and 45 μm at the first vertical surface. The second vertical surface had a length of 180 μm. The first vertical surface had a length of 10 μm. The inclined surface had asperities having an average height (Rc) of 1.2 μm. The inclined surface had steps, as illustrated in FIG. 6A.

An insulating layer made of silicon oxide was then formed by cathode plasma CVD in the same manner as in Example 1. A mask layer was then formed. The mask layer had a circular opening having a diameter of 40 μm, which was concentric with the via-hole. The insulating layer on the electrode pad layer was etched by RIE using a carbon tetrafluoride gas.

A titanium barrier layer and a gold seed layer were formed by sputtering, which was a type of PVD, in the same manner as in Example 1. A gold electroconductive layer was formed by electroplating on the semiconductor substrate opposite the semiconductor element. The gold electroconductive layer had a substantially uniform thickness of 5 μm on average. The resulting semiconductor device had high reliability and improved adhesion of the insulating layer and the metal layer.

Example 3

As in Example 1, a silicon substrate that included a semiconductor element and had a thickness of 200 μm was used. A resist mask layer was formed on the substrate opposite the semiconductor element by patterning a resist. The resist mask layer had a circular opening having a diameter of 60 μm.

A portion of the resist mask layer was exposed to light through a translucent film to form a gray-tone mask having an outer diameter of 80 μm. The gray-tone mask had a circular opening having a diameter of 60 μm. In other words, the mask layer having an opening having a diameter of 80 μm and the gray-tone mask having an opening having a diameter of 60 μm within the opening of the mask layer were formed. The silicon substrate was etched by the BOSCH process to form a via-hole having a first vertical surface, an inclined surface, and a second vertical surface on its sidewall. The width of the via-hole was 80 μm at the second vertical surface and 60 μm at the first vertical surface. The second vertical surface had a length of 160 μm. The first vertical surface had a length of 40 μm. The inclined surface had asperities having an average height (Rc) of 0.6 μm. As illustrated in FIG. 6B, the inclined surface had an inclination angle of approximately zero degrees and had ridges and grooves.

An insulating layer made of silicon oxide was then formed by cathode plasma CVD in the same manner as in Example 1. A mask layer was then formed. The mask layer had a circular opening having a diameter of 50 μm, which was concentric with the via-hole. The insulating layer on the electrode pad layer was etched by RIE using a carbon tetrafluoride gas.

A titanium barrier layer and a gold seed layer were formed by sputtering, which was a type of PVD, in the same manner as in Example 1. A gold electroconductive layer was formed by electroplating on the semiconductor substrate opposite the semiconductor element. The gold electroconductive layer had a substantially uniform thickness of 5 μm on average. The resulting semiconductor device had high reliability and improved adhesion of the insulating layer and the metal layer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-003580 filed Jan. 12, 2011, which is hereby incorporated by reference herein in its entirety.

What is claimed is:
1. A semiconductor device comprising:
a semiconductor substrate having a via-hole that extends from a first surface to a second surface of the semiconductor substrate;
an electrode pad layer disposed on the second surface of the semiconductor substrate, the electrode pad layer serving as the bottom of the via-hole;
an insulating layer disposed on the first surface of the semiconductor substrate and on the sidewall of the via-hole; and
a metal layer disposed on the insulating layer and on the bottom of the via-hole,
wherein the sidewall of the via-hole has an inclined surface such that the bottom of the via-hole has a smaller open- ing size than the open end of the via-hole, and the inclined surface has asperities, wherein the asperities have an average height Rc of 0.2 μm or more and 10 μm or less, and wherein the inclined surface of the sidewall forms an angle of zero degrees or more and less than 83 degrees with respect to the electrode pad layer.

2. The semiconductor device according to claim 1, wherein the sidewall of the via-hole has a first vertical surface and a second vertical surface, the first vertical surface being disposed close to the bottom of the via-hole relative to the inclined surface, the second vertical surface being disposed close to the open end of the via-hole relative to the inclined surface.

3. The semiconductor device according to claim 2, wherein the first vertical surface has a length equal to at least 1/50 and 1/4 or less of the thickness of the semiconductor substrate.

4. The semiconductor device according to claim 2, wherein the opening size of the via-hole at the first vertical surface is at least one half and 9/10 or less of the opening size of the via-hole at the second vertical surface.

* * * * *